(12) United States Patent
Liu et al.

(10) Patent No.: US 8,014,478 B2
(45) Date of Patent: Sep. 6, 2011

(54) METHOD AND APPARATUS FOR IMPULSE NOISE DETECTION AND SUPPRESSION FOR DVB-T

(75) Inventors: Wensheng V. Liu, Pennington, NJ (US); Devan Namboodiri, Holland, PA (US)

(73) Assignee: Broadcom Corporation, Irvine, CA (US)

( * ) Notice: Subject to any disclaimer, the term of this patent is extended or adjusted under 35 U.S.C. 154(b) by 852 days.

(21) Appl. No.: 11/964,373

(22) Filed: Dec. 26, 2007

(65) Prior Publication Data

US 2009/0168929 A1 Jul. 2, 2009

(51) Int. Cl.
*H04B 1/10* (2006.01)
(52) U.S. Cl. ........................................................ 375/346
(58) Field of Classification Search .................. 375/346, 375/130, 147, 316, 285; 455/456.2, 432.1; 370/341, 357
See application file for complete search history.

(56) References Cited

U.S. PATENT DOCUMENTS

| | | | |
|---|---|---|---|
| 5,809,085 A * | 9/1998 | Goodson et al. | 375/320 |
| 6,859,488 B2 * | 2/2005 | Azenkot et al. | 375/147 |
| 7,804,810 B2 * | 9/2010 | Tamura | 370/341 |
| 2004/0116133 A1 * | 6/2004 | Kalhan et al. | 455/456.2 |
| 2004/0196893 A1 * | 10/2004 | Oh et al. | 375/148 |

OTHER PUBLICATIONS

Digital TV Group, "Digital Terrestrial Television", Requirements for Interoperability, Issue 5.0, (United Kingdom, Jul. 2007).
Lago-Fernández et al., "Modelling Impulsive Interference in DVB-T—Statistical Analysis, Test Waveforms and Receiver Performance", BBC Research & Development, EBU Technical Review, (Jul. 2004).
Suraweera et al., "Analysis of Impulse Noise Mitigation Techniques for Digital Television Systems", Department of Electronic Engineering, La Trobe University, (Victoria, Australia, 2003).

* cited by examiner

*Primary Examiner* — Khai Tran
(74) *Attorney, Agent, or Firm* — McAndrews, Held & Malloy, Ltd.

(57) ABSTRACT

A method and apparatus for adaptive impulse noise detection and suppression (INDS) where information regarding detected impulse noise (IN) pulses is used to adjust detection and suppression parameters. To decrease the rate of false detection, groups of samples, instead of individual samples, of the digitized received signal are used to detect the presence of IN pulses. The method and apparatus for adaptive INDS may be used in communication systems employing single-carrier or multi-carrier modulation schemes, and is preferably used for Orthogonal Frequency Division Multiplexing (OFDM) modulation. The proposed adaptive INDS systems may be used to effectively reduce the effects of impulse noise and improve the quality of received signals.

32 Claims, 4 Drawing Sheets

METHOD AND APPARATUS FOR IMPULSE NOISE DETECTION AND SUPPRESSION FOR DVB-T

FIELD OF INVENTION

The present invention is related to impulse noise detection and suppression in communication signals.

BACKGROUND

Digital Video Broadcasting (DVB) is a suite of open standards providing technical guidelines for the compression and transmission of digital audio and video data for digital television. Current DVB—Terrestrial (DVB-T) standards, designed specifically for digital terrestrial television systems, support various source coding techniques for video compression including Moving Picture Experts Group 2 (MPEG-2) compression. These standards include the transmission of signals using Orthogonal Frequency Division Multiplexing (OFDM) modulation, a multi-carrier modulation scheme where symbols are modulated onto a large quantity of orthogonal sub-carriers. An OFDM symbol is made up of multiple sub-carriers, where each sub-carrier occupies a separate narrowband sub-channel of a wideband channel, and each sub-carrier is modulated with a single-carrier modulation scheme, such as quadrature amplitude modulation (QAM). By employing many slowly-modulated narrowband sub-channels, OFDM modulation is more robust than single-carrier modulation schemes to certain channel conditions including narrowband co-channel interference and multipath fading. As a result, OFDM systems can generally employ less complex equalization techniques at the receiver.

FIG. 1 illustrates a conventional receiver front-end in a DVB-T system, which typically includes an antenna or input 101 for receiving analog signals containing the compressed video data; a tuner 102 for amplifying, filtering and down-converting received analog signals to an intermediate frequency (IF); an analog-to-digital converter (ADC) 104 for sampling and digitizing received analog signals; and a down converter 106 for converting digital signals to baseband. Down converter 106 is typically followed by a DVB-T demodulation stage and an error correction stage (not shown).

While OFDM modulation is generally more resistant to channel interference than single-carrier modulation schemes, DVB-T systems and other communication systems employing OFDM are still vulnerable to distortion effects in received signals due to short term random impulse noise (IN) interference at the receiver. In general, IN occurs for short periods of time, and is unpredictable. For example, IN may result from interfering radio signals from other communication systems, or electrical signals generated by nearby electrical devices. The mitigation of IN has been recognized as a major performance issue in the design of DVB receivers, and is used as a key factor in evaluating the performance and quality of DVB receiver devices.

IN detection and suppression (INDS) techniques have been proposed in order to reduce the effects of IN. FIG. 2 illustrates an existing DVB-T receiver front-end 200 employing INDS by way of IN detector 208 and IN suppressor 210. In general, IN detector 208 considers each digital received signal sample provided by ADC 104 individually to determine if IN is present in the sample. Existing techniques for detecting IN in a signal sample include, for example, evaluating the probability density function (PDF) of the sample noise and evaluating the time correlation of consecutive impulse events. If IN is detected in a sample, IN detector 208 notifies IN suppressor 210, which selectively adjusts the amplitude of the corresponding sample using, for example, amplitude clipping that limits the maximum sample value, or nulling that sets the sample value to zero. The adjusted (suppressed) sample is then provided to down converter 106 for further processing.

One major disadvantage of existing INDS systems, including the one illustrated in FIG. 2, is a degradation in the quality of the received signal when IN is not present. Existing INDS systems are designed to suppress IN when it is detected. However, false detection of IN can occur causing erroneous suppression and distortion of the received signal. Additionally, existing INDS implementations tend to be fixed and do not adapt detection and suppression parameters based on the frequency of IN in order to reduce the false detection rate. Accordingly, there is a need for improved INDS design that can effectively reduce the effects of IN when present in the received signal, without sacrificing performance of the receiver in the absence of IN.

SUMMARY

A method and apparatus for impulse noise detection and suppression (INDS) employs an INDS adaptor that adjusts impulse noise (IN) detection and suppression parameters according to characteristics of IN detected in a received signal. To decrease the rate of false detection, groups of samples of the digitized received signal are used to detect the presence of an IN pulse, instead of individual samples. The proposed adaptive INDS process and system improves noise reduction resulting from impulse noise while minimizing performance loss due to false detection when IN is absent. The method and apparatus may be used in communication systems employing single-carrier or multi-carrier modulation schemes, and may be used for Orthogonal Frequency Division Multiplexing (OFDM) modulation.

BRIEF DESCRIPTION OF THE DRAWINGS

A more detailed understanding may be had from the following description, given by way of example and to be understood in conjunction with the accompanying drawings wherein.

DETAILED DESCRIPTION

The apparatus and method disclosed herein may be used in any type of communication system employing multi-carrier modulation schemes, including but not limited to Orthogonal Frequency Division Multiplexing (OFDM) modulation, as well as single-carrier modulation schemes, including, but not limited to, quadrature amplitude modulation (QAM). For illustrative purposes, Digital Video Broadcasting-Terrestrial (DVB-T) systems employing OFDM modulation are used herein as an example. However, the apparatus and method disclosed herein are applicable to any variety of communication system that suffers from impulse noise interference effects at the receiver. Examples of applicable communication systems include, but are not limited to, digital video broadcasting systems including Digital Video Broadcasting-Terrestrial (DVB-T), Digital Video Broadcasting-Handheld (DVB-H), Digital Multimedia Broadcasting (DMB), Integrated Services Digital Broadcasting (ISDB), MediaFLO, digital radio systems, wireless and wired communication systems, and in particular communication systems employing OFDM including, but not limited to, WiMAX, HiperMAN and 3GPP Long Term Evolution (LTE).

Figure 1:
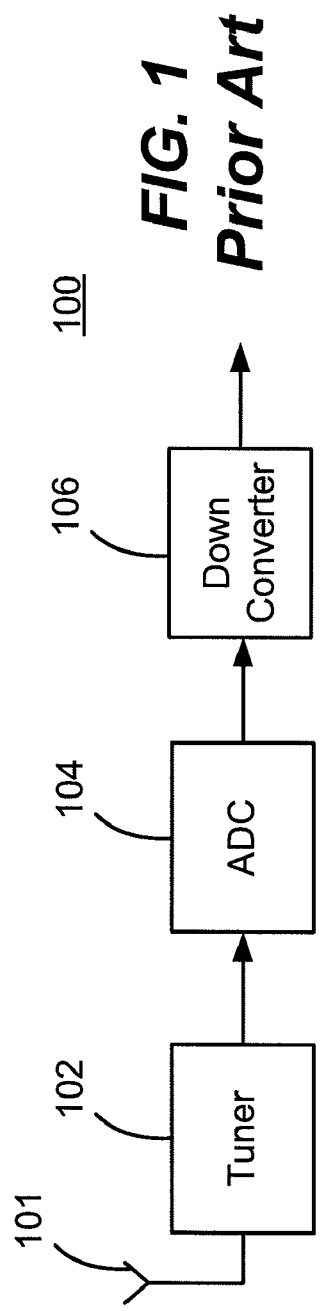
FIG. 1 is a block diagram of a conventional receiver front-end in a Digital Video Broadcasting-Terrestrial (DVB-T) system.
Figure 2:
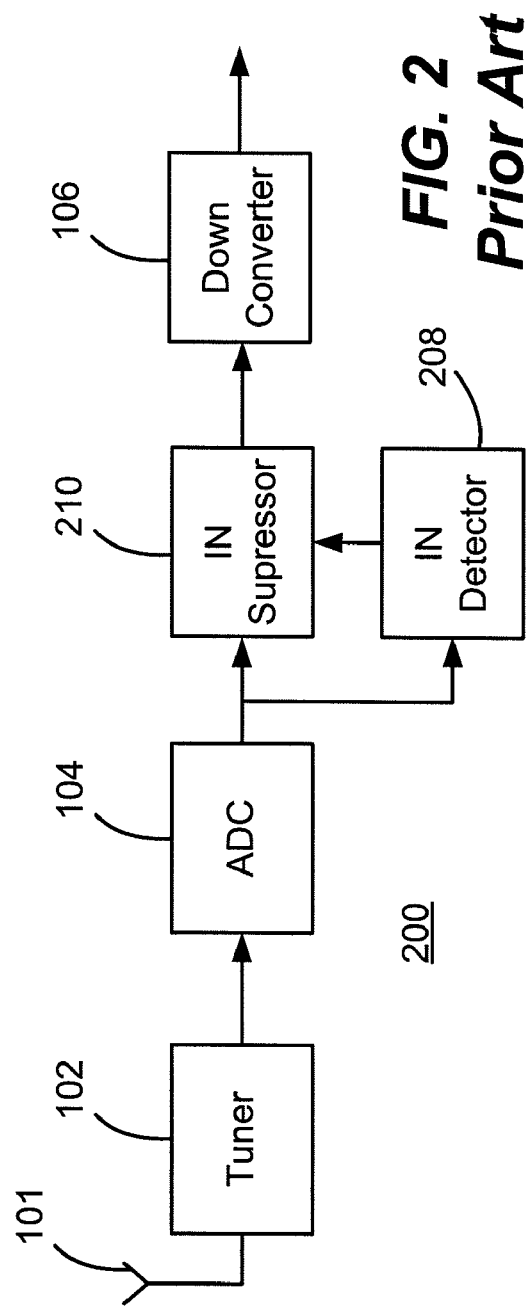
FIG. 2 is a block diagram of an existing DVB-T receiver front-end employing impulse noise detection and suppression (INDS)
Figure 3:
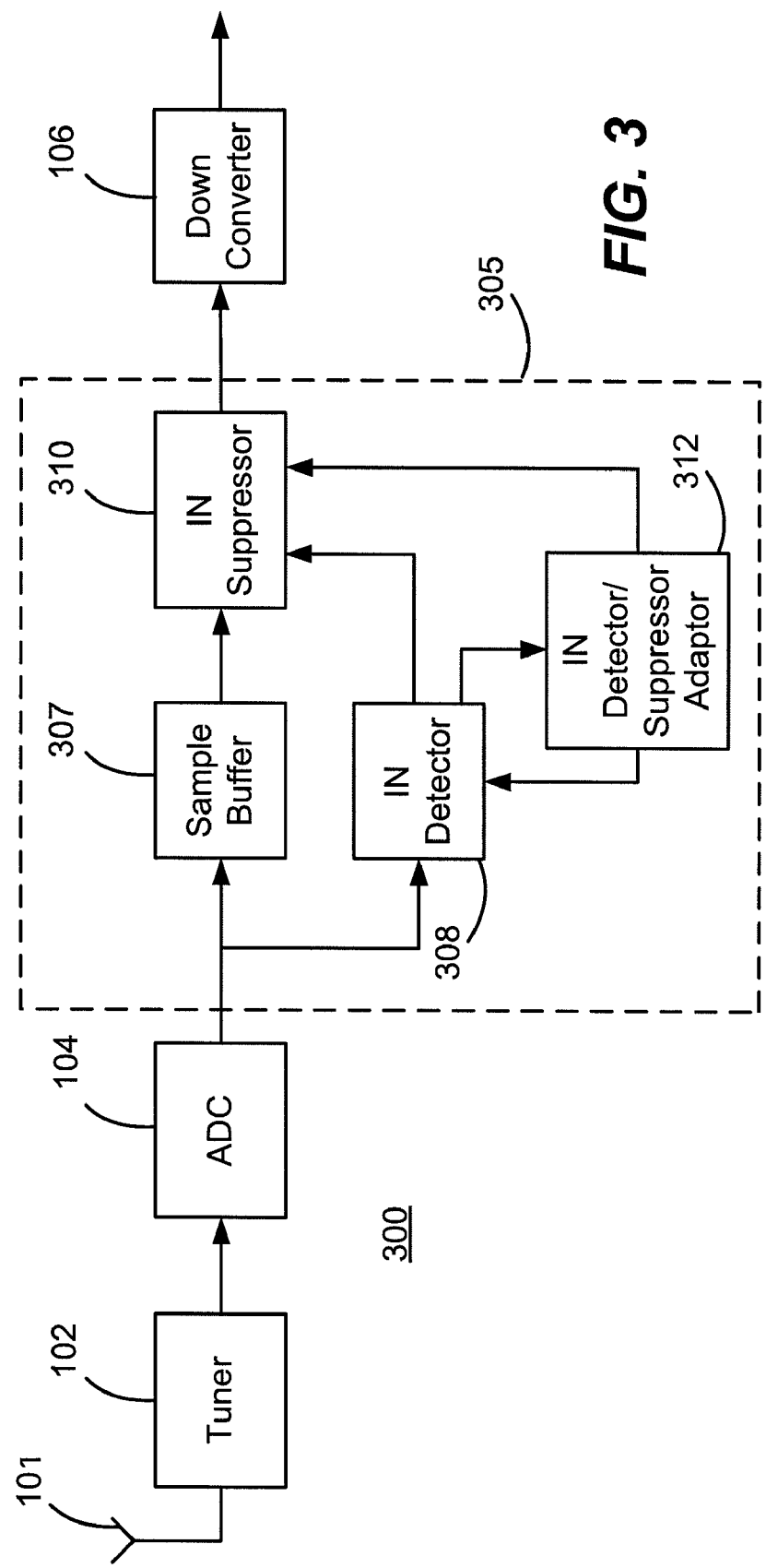
FIG. 3 is a block diagram of a DVB-T receiver front-end employing adaptive INDS utilizing the teachings herein.

FIG. 3 shows a DVB-T receiver front-end 300 employing an adaptive INDS technique. Receiver front-end 300 includes an input, such as antenna 101, a tuner 102, an analog-to-digital converter (ADC) 104, an adaptive impulse noise detection and suppression (INDS) component 305 and a down converter 106.

Antenna 101 is used to receive signals, which are filtered, amplified and down-converted to an intermediate frequency by tuner 102. ADC 104 generates samples of the received signal and provides them to adaptive INDS component 305, which preferably includes sample buffer 307, IN detector 308, IN suppressor 310 and IN detector/suppressor adaptor 312. Adaptive INDS component 305 provides the samples after noise suppression to down converter 106. Although adaptive INDS component 305 is illustrated as being coupled between ADC 104 and down converter 106, it could exist anywhere within the receiver chain, for example, following down converter 106 and before DVB-T modulation (not shown) while achieving similar results. The receiver configuration herein is used for illustrative purposes, whereas the proposed adaptive INDS component 305 could be applied to any digitized signal in any receiver.

Sample buffer 307 receives the digital signal output from the ADC 104 and stores groups of samples while IN detector 308 receives the digital signal output from the ADC 104 and determines the existence of IN pulses in the samples. The samples are preferably successive samples. The IN detector 308 evaluates the power levels of multiple samples within each group of samples relative to a threshold value in order to determine the presence of an IN pulse. A group of samples (instead of an individual sample) is used because even though an IN pulse received at antenna 101 may be very short, the length of the IN pulse increases at the output of tuner 102 because of the tuner's impulse response, and thus may span multiple samples. By way of example, a duration of an IN pulse at the output of tuner 102 may be between 200 ns and 300 ns, and for ADC sampling frequencies of 20 MHz or higher, the IN pulse will accordingly span multiple samples. Thus, using a group of samples for detecting IN pulses reduces the frequency of false detection. Sampling at higher frequencies, which implies more samples for detection per IN impulse, also generally helps reduce the false detection probability.

Once IN detector 308 has detected an IN noise pulse spanning one or more samples, it provides the starting position and length, in terms of the number of samples of the detected IN pulse, to IN suppressor 310. IN suppressor 310 receives the corresponding samples from sample buffer 307 and adjusts the amplitude of the indicated samples using, for example, one of the aforementioned techniques of amplitude clipping or nulling. Additionally, IN detector 308 may keep track of the frequency with which IN pulses are detected in the input sample stream, and provide frequency information of the detected IN pulses to IN detector/suppressor adaptor 312. Based on the frequency information, IN detector/suppressor adaptor 312 determines if, and how, to adjust the parameters used for detection and suppression. By adjusting detection and suppression parameters used in IN detector 308 and IN suppressor 310, respectively, IN detection and suppression is optimized for the current channel conditions and IN frequency.

Figure 4:
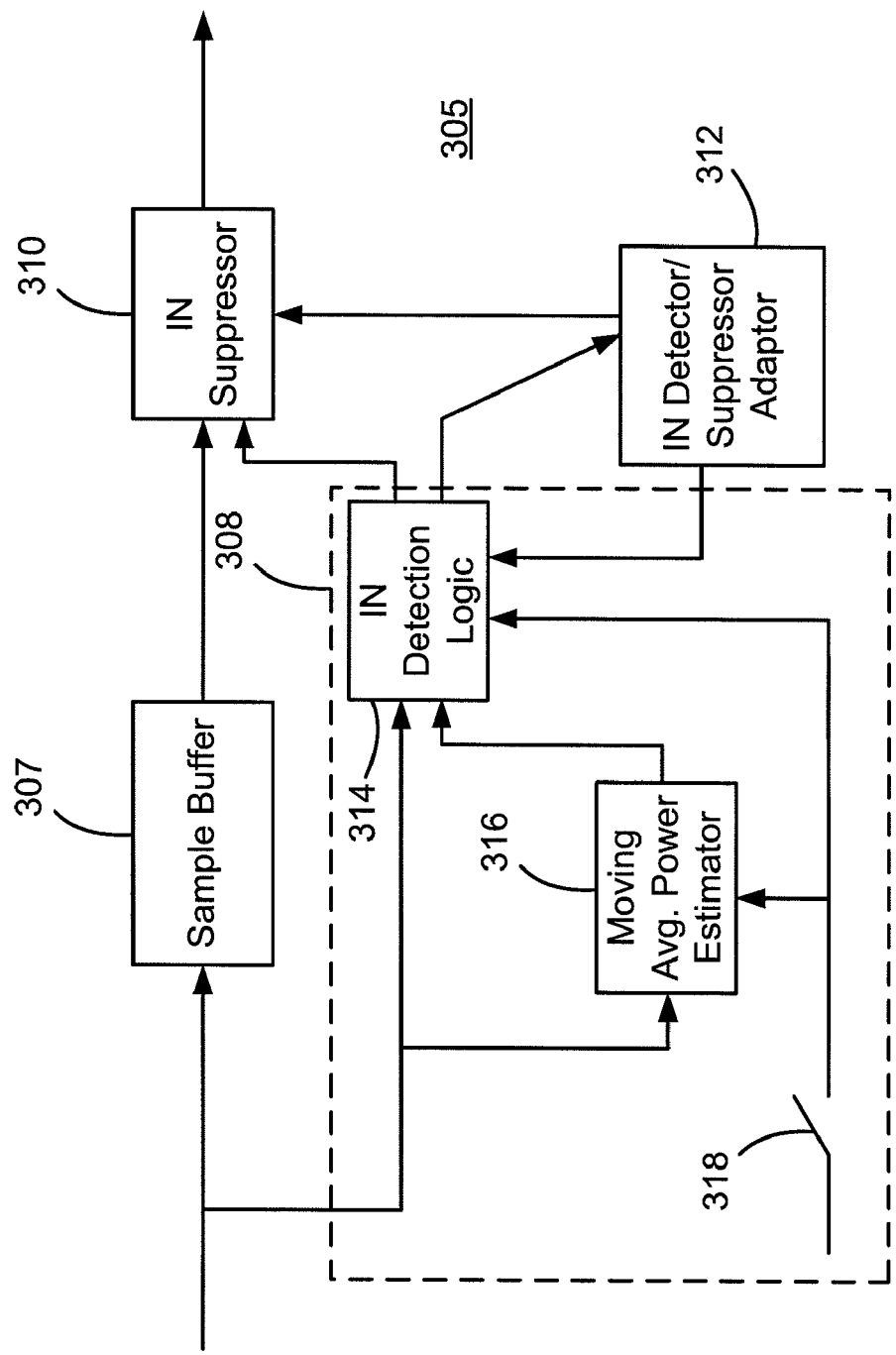
FIG. 4 is a block diagram of an adaptive INDS component utilizing the teachings herein.

Adaptive INDS component 305 will now be described in detail with respect to FIG. 4. Referring to FIG. 4, a detailed view of adaptive INDS component 305 is shown. In particular, IN detector 308 includes IN detection logic component 314, moving average power estimator 316 and IN detector enable switch 318 (optional). IN detector 308 receives and analyses samples while sample buffer 307 receives and stores groups of N samples to be processed by IN suppressor 310 based on information provided by IN detector 308. Optional IN detector enable switch 318 may be included to turn on or off IN detector 308, as desired.

Moving average power estimator 316 generates an estimate of the average power $\tilde{P}(n)$ for each group of N samples up to sample n as follows:

$$\tilde{P}(n) = \frac{1}{N}\sum_{i=0}^{N-1} x_{n-i}^2 = \frac{1}{N}(x_n^2 + x_{n-1}^2 + \ldots + x_{n-N+1}^2); \quad \text{Equation (1)}$$

where $x_{n-i}^2$ is the instantaneous power of sample n−i in the group of N samples. The average power estimate $\tilde{P}(n)$ is used as a power threshold for detecting IN pulses, as will be described in detail hereafter.

The number N is an adjustable parameter and affects the accuracy of the average signal power estimate, which is critical to achieving the objective of maintaining high detection probability of IN while reducing the false alarm rate. A larger number N generally improves the average power estimate. However, the number N may be limited, as a matter of practicality, by associated hardware cost and added latency (for example, by the size of sample buffer 307). To keep the number N small and reduce hardware cost and latency, a low pass infinite impulse response (IIR) filter (not shown) may optionally be employed to smooth out short term variations in the moving average power estimate $\tilde{P}(n)$. An example of an IIR filter is a one-tap filter described by:

$$P(n) = \alpha P(n-1) + (1-\alpha)P_{filter}(n); \quad \text{Equation (2)}$$

where P(n) is the smoothened average power estimate, and α is the filter coefficient that is chosen such that the short-term fluctuation in the moving average power estimate $P_{filter}(n)$ is removed.

The average power estimate P(n) is provided by moving average power estimator 316 to IN detection logic component 314, which preferably uses P(n) to generate a power threshold for detecting the presence of an IN pulse in the group of N samples. Alternatively, other power values may be used as the power threshold, for example a fixed power value or a power value calculated using a different formula, as desired.

IN detection logic component 314 attempts to detect the presence of IN pulses, each pulse possibly spanning multiple samples, in each group of N samples using the corresponding power threshold, as described hereinafter. When detection is positive, it stores the position of the first detected sample and the length in terms of number of detected samples of each identified IN pulse.

The preferred detection method employed by IN detection logic component 314 is as follows. For each sample, the power value of the sample is compared to the power threshold, where the power threshold is preferably proportional to the corresponding average power estimate P(n) provided by moving average power estimator 316. If the sample power value is above the power threshold, a counter is incremented for that group of N samples, and if it is the first sample to exceed the power threshold within the group, then the position of the sample is also stored in memory (not shown). That position is the beginning of a potential IN pulse. IN detection logic component 314 then determines the end of the potential IN pulse by determining the position of the first sample within the group of samples for which a number M of consecutive samples are below the threshold.

Subsequently, IN detection logic component 314 determines if the detected potential IN pulse is an actual IN pulse by making the following comparisons. First, the counter value is compared to a counter threshold q, and if the counter value is larger than the counter threshold q, then the average power of the IN pulse is determined by calculating the average power of the samples in the potential IN pulse. Subsequently, the calculated average power of the IN pulse is compared to a power detection threshold p. If the calculated average power of the IN pulse is larger than the power detection threshold p, the detected potential IN pulse is declared as an actual IN pulse, and the starting position and length of the detected IN pulse in terms of number of samples is provided to IN suppressor 310.

IN suppressor 310 preferably performs a clipping function on the samples indicated as being part of the detected IN pulse. The clipped samples may also optionally be multiplied by a small programmable scaling constant. The samples that are not indicated as being part of an IN pulse are simply passed on without adjustment or suppression to the next stage in the receiver, for example, down converter 106 from FIG. 3. The clipping and scaling operation is performed on the amplitude x of each detected sample as follows:

$$y = \begin{cases} cx, & \text{if } |x| < a\sigma \\ ca\sigma, & \text{if } |x| \geq a\sigma; \end{cases} \quad \text{Equation (3)}$$

where y is the amplitude of the resulting clipped and scaled sample, $\sigma$ is the square root of the normalized moving average power estimate P(n), a is the clipping factor and c is the scaling constant that is non-negative and less than 1. Both constants a and c are programmable and control the level of noise suppression. A special case occurs if either a or c is set to zero, where the overall effect of operation is equivalent to nulling or inserting zeros in place of the IN sample. The combination of clipping by factor c and linear scaling by factor a can preserve some signal quality in case of false alarm, but also successfully suppresses the noise when IN is indeed present.

Because the IN environment within which a DVB receiver has to function may vary significantly, some or all of the IN detection parameters may be dynamically adapted so that receiver performance can be optimized for different IN scenarios and characteristics. The IN detection parameters that are adjustable include: the number of samples per group N, the IIR filter coefficient $\alpha$, the number of samples M designating the end of a potential IN pulse, the counter threshold q and the power detection threshold p. Alternatively, other parameters may be adjusted as desired. IN detector/suppressor adaptor 312 is responsible for adjusting some or all of these parameters as follows. The optional IN detector/suppressor adaptor 312 for adapting detection and suppression parameters in IN detector 308 and IN suppressor 310, respectively, is described in detail below.

When IN detector 308 is initialized, a set of default detection parameters M, N, $\alpha$, q and p that result in a small false alarm rate are used for IN detector 308. For example, a small false alarm probability is generally achieved using relatively large values of q, p, and M. However, particular values for each of the detection parameters are highly dependent on the sampling frequency.

Whenever an IN pulse is detected by IN detection logic component 314, IN detector/suppressor adaptor 312 is notified and triggers an IN observation timer to count the number of detected IN pulses over an observation window equal to, for example, the period of time for one group of N samples. If the number of detected IN pulses in the observation interval is larger than or equal to an IN pulse frequency threshold, IN detector 308 is notified by IN detector/suppressor adaptor 312 to use an alternative set of detection parameters in order to increase detection probability. For example, decreasing p, decreasing q or decreasing M, or any combination thereof, can help to increase the detection probability.

IN detector 308 continues to detect IN pulses in the sample stream using the alternative set of detection parameters, and continues to notify IN detector/suppressor adaptor 312 when an IN pulse is detected. IN detector/suppressor adaptor 312 continues to compare the number of detected IN pulses over an observation window, and when the number of detected IN pulses drops below the IN pulse frequency threshold, IN detector/suppressor adaptor 312 notifies IN detector 308 to return to using the original default detection parameters. For example, for an observation window equal to 200 μs equivalent of samples, a possible value for IN pulse frequency threshold is 2. While M, N, $\alpha$, q and p are described as being the set of adjustable detection parameters, some or all may be fixed. Alternatively, other parameters may also be adjusted in a similar manner as described above.

Adaptively adjusting detection schemes or parameters is used to deal with variations in the channel conditions of the received signal and reduce the number of false alarms. The number of IN pulses that may occur can vary greatly depending on the environment in which the receiver is deployed. For example, sometimes there may be no IN pulses for several seconds while at other times there can be several IN pulses arriving at the tuner within a couple of 100 μs. A fixed scheme or fixed set of detection parameters designed to detect a maximum number of impulses under more noisy conditions can introduce high levels of false alarms and thus degrade receiver performance under low IN rates.

For similar reasons, IN detector/suppressor adaptor 312 may also adjust some or all of the suppression parameters used by IN suppressor 310, including clipping factor c and scaling factor a. Due to the error correction capability of Viterbi decoding applied in a DVB receiver, the DVB receiver can tolerate a small number of low-power IN pulses that go undetected and unsuppressed over periods of time while still producing error-free videos. As described hereinbefore, IN detector/suppressor adaptor 312 monitors the number of detected IN pulses over an observation window. When the number of detected pulses is below an IN pulse frequency threshold, which may be the same or different from the one used for the IN detection parameters, IN detector/suppressor adaptor 312 instructs IN suppressor 310 to use a modest level of noise suppression by applying larger values of a and/or c to the detected samples. Alternatively, when the number of detected pulses is above the IN pulse frequency threshold, IN suppressor 310 is instructed to use a heavy suppression level by applying smaller values of a and/or c to the detected samples. The dynamic adjustment of the suppression parameters is effective in reducing false detection because when the number of detected pulses is small, a fair portion of them may be false detection and a modest level of suppression provides less distortion to useful samples. Example ranges of values include 1 to 2 for parameter a and 0.25 to 0.5 for parameter c.

Figure 5:
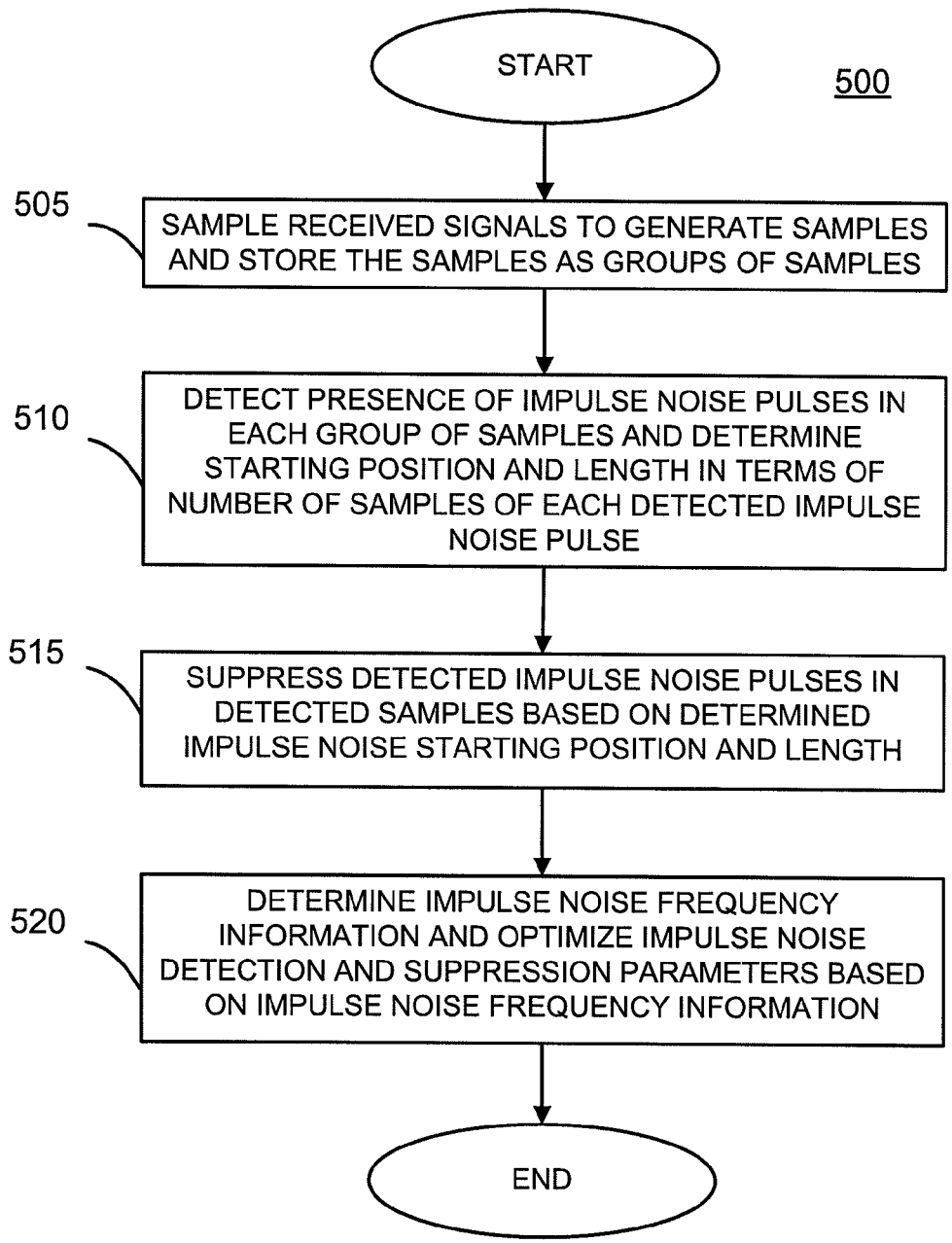
FIG. 5 is a flow diagram for adaptive INDS utilizing the teachings herein.

FIG. 5 shows a flow diagram for an adaptive INDS process 500. Samples are generated by digitally sampling a received analog signal, and stored in groups of samples, 505. Occurrences of IN pulses are detected in each group of samples and the starting position and length in terms of number of samples of each detected IN pulse is determined, 510. The detected IN pulses are suppressed in the detected samples based on the determined IN pulse starting position and length, preferably using a clipping function, 515. Optionally, the IN frequency information is determined, and detection and suppression parameters are optimized based on the IN frequency information, 520.

The proposed adaptive INDS system and method, with the properties and advantages described hereinbefore, has been shown to provide 10 dB or more improvement in some impulse noise test modes in DVB-T receivers, thus providing considerable performance improvement. In addition, it greatly reduces the occurrence of distortion and performance degradation in the receiver when IN is not present.

Although the features and elements are described in particular combinations, each feature or element can be used alone without the other features and elements or in various combinations with or without other features and elements. The methods or flow charts provided may be implemented in a computer program, software, or firmware tangibly embodied in a computer-readable storage medium for execution by a general purpose computer or a processor. Examples of computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine.

What is claimed is:

1. A method for impulse noise (IN) detection and suppression in a received signal comprising:
    comparing a power level of each sample within a group of samples in a received signal to a power threshold;
    determining the presence of an IN pulse in the group of samples by detecting at least one sample having a power level which exceeds a power threshold; and
    suppressing a power level for each sample in the group of samples by multiplying the magnitude of the sample by a clipping factor.

2. The method of claim 1 further comprising generating the power threshold by:
    defining groups of N samples;
    calculating a moving average power estimate of each group of N samples; and
    setting the power threshold proportional to the moving average power estimate.

3. The method of claim 2 wherein determining the presence of an IN pulse for a group of N samples further includes determining a position of a first sample that exceeds the power threshold and determining a position of a second sample, following the first sample, for which the power level of M samples falls below the power threshold.

4. The method of claim 3 further comprising:
    determining an IN frequency value in the received signal based on a number of detected IN pulses over an observation interval; and
    adjusting detection parameters based on the IN frequency value.

5. The method of claim 4 wherein adjusting the detection parameters includes adjusting at least one of N and M, wherein if the IN frequency value is above a frequency threshold, then at least one of M is decreased and N is increased, and if the IN frequency value is below the frequency threshold then at least one of M is increased and N is decreased.

6. The method of claim 2 further comprising applying a low pass infinite impulse response (IIR) with filter coefficient a to the moving average power estimate.

7. The method of claim 1 wherein suppressing the power level for each sample in the group of samples further includes multiplying by a scaling constant with a value in between 0 and 1.

8. The method of claim 1 wherein determining the presence of an IN pulse in the group of samples includes:
    determining a number of samples in the group of samples that exceed the power threshold, and if the number of samples is above a counter threshold q, calculating an average power of the samples in the group of samples;
    comparing the average power to a power detection threshold p; and
    determining that an IN pulse is present in the group of samples if the average power exceeds the power detection threshold p.

9. The method of claim 8 further comprising:
    determining an IN frequency value in the received signal based on a number of detected IN pulses over an observation interval; and
    adjusting detection parameters based on the IN frequency value, wherein the adjusting detection parameters includes adjusting at least one of the counter threshold q and the power detection threshold p, wherein if the IN frequency value is above a frequency threshold then at least one of the counter threshold q and the power detection threshold p are decreased and if the IN frequency value is below the frequency threshold then at least one of the counter threshold q and the power detection threshold p are increased.

10. The method of claim 1 further comprising:
    determining an IN frequency value in the received signal based on a number of detected IN pulses over an observation interval; and
    adjusting at least one of detection parameters and suppression parameters based on the IN frequency value.

11. The method of claim 10 wherein adjusting the suppression parameters includes adjusting the clipping factor, wherein if the IN frequency value is above a frequency threshold then the clipping factor is decreased and if the IN frequency value is below the frequency threshold then the clipping factor is increased.

12. The method of claim 10 wherein:
    suppressing the power level for each sample in the group of samples further includes multiplying by a scaling constant with a value in between 0 and 1; and
    adjusting the suppression parameters includes adjusting at least one of the clipping factor and the scaling constant, wherein if the IN frequency value is above a frequency threshold, then at least one of the clipping factor and scaling constant are decreased and if the IN frequency value is below the frequency threshold then at least one of the clipping factor and scaling constant are increased.

13. The method of claim 1 wherein the group of samples includes consecutive samples.

14. A receiver comprising:
an impulse noise (IN) detector configured to:
compare a power level of each sample within a group of samples to a power threshold;
determine the presence of an IN pulse in the group of samples by detecting at least one sample having a power level which exceeds a power threshold; and
an IN suppressor configured to suppress a power level for each sample in the group of samples by multiplying the magnitude of the sample by a clipping factor.

15. The receiver of claim 14 further comprising a moving average power estimator configured to:
define groups of N samples; and
calculate a moving average power estimate of each group of N samples, wherein the IN detector is configured to set the power threshold proportional to the moving average power estimate.

16. The receiver of claim 15 wherein the IN detector is configured to determine the presence of an IN pulse for a group of N samples by determining a position of a first sample that exceeds the power threshold and determining a position of a second sample, following the first sample, for which the power level of M samples falls below the power threshold.

17. The receiver of claim 16 further comprising an IN detector/suppressor adaptor configured to:
determine an IN frequency value in the received signal based on a number of detected IN pulses over an observation interval; and
adjust detection parameters based on the IN frequency value.

18. The receiver of claim 17 wherein adjusting the detection parameters includes adjusting at least one of N and M, wherein if the IN frequency value is above a frequency threshold, then at least one of M is decreased and N is increased, and if the IN frequency value is below the frequency threshold then at least one of M is increased and N is decreased.

19. The receiver of claim 15 further comprising a low pass infinite impulse response (IIR) filter configured to apply a low pass infinite impulse response (IIR) with filter coefficient a to the moving average power estimate.

20. The receiver of claim 14 wherein the IN suppressor is configured to suppress the power level for each sample in the group of samples by further multiplying by a scaling constant with a value in between 0 and 1.

21. The receiver of claim 14 wherein the IN detector is configured to determine the presence of an IN pulse in the group of samples by:
determining a number of samples in the group of samples that exceed the power threshold, and if the number of samples is above a counter threshold q, calculating an average power of the samples in the group of samples;
comparing the average power to a power detection threshold p; and
determining that an IN pulse is present in the group of samples if the average power exceeds the power detection threshold p.

22. The receiver of claim 21 further comprising an IN detector/suppressor adaptor configured to:
determine an IN frequency value in the received signal based on a number of detected IN pulses over an observation interval; and
adjust detection parameters based on the IN frequency value, wherein the adjusting detection parameters includes adjusting at least one of the counter threshold q and the power detection threshold p, wherein if the IN frequency value is above a frequency threshold then at least one of the counter threshold q and the power detection threshold p are decreased and if the IN frequency value is below the frequency threshold then at least one of the counter threshold q and the power detection threshold p are increased.

23. The receiver of claim 14 further comprising an IN detector/suppressor adaptor configured to:
determine an IN frequency value in the received signal based on a number of detected IN pulses over an observation interval; and
adjust at least one of detection parameters and suppression parameters based on the IN frequency value.

24. The receiver of claim 23 wherein the IN detector/suppressor adaptor is configured to adjust suppression parameters by adjusting the clipping factor, wherein if the IN frequency value is above a frequency threshold then the clipping factor is decreased and if the IN frequency value is below the frequency threshold then the clipping factor is increased.

25. The receiver of claim 23 wherein:
the IN suppressor is configured to suppress a power level for each sample in the group of samples by further multiplying by a scaling constant with a value in between 0 and 1; and
the IN detector/suppressor adaptor is configured to adjust suppression parameters by adjusting at least one of the clipping factor and the scaling constant, wherein if the IN frequency value is above a frequency threshold, then at least one of the clipping factor and scaling constant are decreased and if the IN frequency value is below the frequency threshold then at least one of the clipping factor and scaling constant are increased.

26. The receiver of claim 14 wherein the group of samples includes consecutive samples.

27. A computer-readable storage medium containing a first set of instructions adapted to create a processor, wherein the processor is configured to implement a second set of instructions, the second set of instructions comprising:
a comparing code segment for comparing a power level of each sample from a received signal to a power threshold;
a detecting code segment for detecting an IN pulse in the samples, if any, by determining a group of samples in which at least one sample exceeds the power threshold; and
an adjusting code segment for adjusting a power level for each sample in the determined group of samples by multiplying by a clipping factor.

28. A computer-readable storage medium containing a set of instructions, the set of instructions comprising:
a comparing code segment for comparing a power level of each sample from a portion of a received signal to a power threshold;
a detecting code segment for detecting an IN pulse in the samples, if any, by determining a group of samples in which at least one sample exceeds the power threshold; and
an adjusting code segment for adjusting a power level for each sample in the determined group of samples by multiplying by a clipping factor.

29. A method for impulse noise (IN) detection and suppression in a received signal comprising:

comparing a power level of each sample within a group of samples in an OFDM received signal to a power threshold;

determining the presence of an IN pulse in the group of samples in the OFDM signal by detecting at least one sample having a power level which exceeds a power threshold; and suppressing a power level for each sample in the group of samples by multiplying the magnitude of the sample by a clipping factor.

30. A receiver comprising:

an impulse noise (IN) detector configured to:

compare a power level of each sample within a group of samples in an OFDM signal to a power threshold;

determine the presence of an IN pulse in the group of samples in the OFDM signal by detecting at least one sample having a power level which exceeds a power threshold; and an IN suppressor configured to suppress a power level for each sample in the group of samples in the OFDM signal by multiplying the magnitude of the sample by a clipping factor.

31. A computer-readable storage medium containing a first set of instructions adapted to create a processor, wherein the processor is configured to implement a second set of instructions, the second set of instructions comprising:

a comparing code segment for comparing a power level of each sample from a received OFDM signal to a power threshold;

a detecting code segment for detecting an IN pulse in the samples, if any, by determining a group of samples in the OFDM signal in which at least one sample exceeds the power threshold; and an adjusting code segment for adjusting a power level for each sample in the determined group of samples in the OFDM signal by multiplying by a clipping factor.

32. A computer-readable storage medium containing a set of instructions, the set of instructions comprising:

a comparing code segment for comparing a power level of each sample from a portion of a received OFDM signal to a power threshold;

a detecting code segment for detecting an IN pulse in the samples, if any, by determining a group of samples in which at least one sample exceeds the power threshold; and an adjusting code segment for adjusting a power level for each sample in the determined group of samples by multiplying by a clipping factor.

* * * * *